US009524775B1

(12) United States Patent
Papandreou et al.

(10) Patent No.: US 9,524,775 B1
(45) Date of Patent: Dec. 20, 2016

(54) CORRELATION DETECTOR

(71) Applicant: International Business Machines Corporation, Armonk, NY (US)

(72) Inventors: Nikolaos Papandreou, Rueschlikon (CH); Abu Sebastian, Rueschlikon (CH); Tomas Tuma, Rueschlikon (CH)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/918,031

(22) Filed: Oct. 20, 2015

(51) Int. Cl.
*G11C 11/00* (2006.01)
*G11C 13/00* (2006.01)

(52) U.S. Cl.
CPC ....... *G11C 13/0069* (2013.01); *G11C 13/0061* (2013.01)

(58) Field of Classification Search
None
See application file for complete search history.

(56) References Cited

U.S. PATENT DOCUMENTS

| 6,993,246 | B1 | 1/2006 | Pan et al. | |
|---|---|---|---|---|
| 8,131,792 | B1 | 3/2012 | Koudas et al. | |
| 8,762,302 | B1 | 6/2014 | Spivack et al. | |
| 9,053,790 | B1* | 6/2015 | Hu | G11C 13/0069 |
| 2011/0234508 | A1* | 9/2011 | Oda | G06F 3/044 345/173 |
| 2014/0098600 | A1* | 4/2014 | Kim | G11C 11/1695 365/158 |
| 2014/0129498 | A1 | 5/2014 | Bichler et al. | |

FOREIGN PATENT DOCUMENTS

CN 104092578 10/2014

OTHER PUBLICATIONS

Alex Philp, Igniting the Future of Cognitive Computing; http://www.ibmbigdatahub.com/blog/igniting-future-cognitive-computing.
Ling Chen, Ling-Jun Zou, Li Tu, A Clustering Algorithm for Multiple Data Streams Based on Spectral Component Similarity; http://www.sciencedirect.com/science/article/pii/S0020025511004543.
List of IBM Patents or Patent Applications Treated as Related; (Appendix P), Filed Feb. 10, 2016, 2 pages.
Nikolaos Papandreou, et al., "Correlation Detector", U.S. Appl. No. 14/949,126, filed Nov. 23, 2015.

* cited by examiner

*Primary Examiner* — Son Dinh
*Assistant Examiner* — Sultana Begum
(74) *Attorney, Agent, or Firm* — Cantor Colburn LLP; Daniel Morris

(57) ABSTRACT

A correlation detector comprises an input unit configured to receive a plurality of parallel data streams of discrete events. The correlation detector further comprises a memory array having a plurality of resistive memory elements. At least one resistive memory element is allocated to each of the parallel data streams. Furthermore, a programming array is provided comprising a plurality of programming elements. At least one programming element is allocated to each resistive memory element for applying a programming signal to the respective memory element. The correlation detector comprises further a control unit that is configured to control the programming signals as a function of a co-arrival characteristic of the discrete events. A correlation unit is configured to detect correlations between the received data streams based on resistance changes of the resistive memory elements.

12 Claims, 7 Drawing Sheets

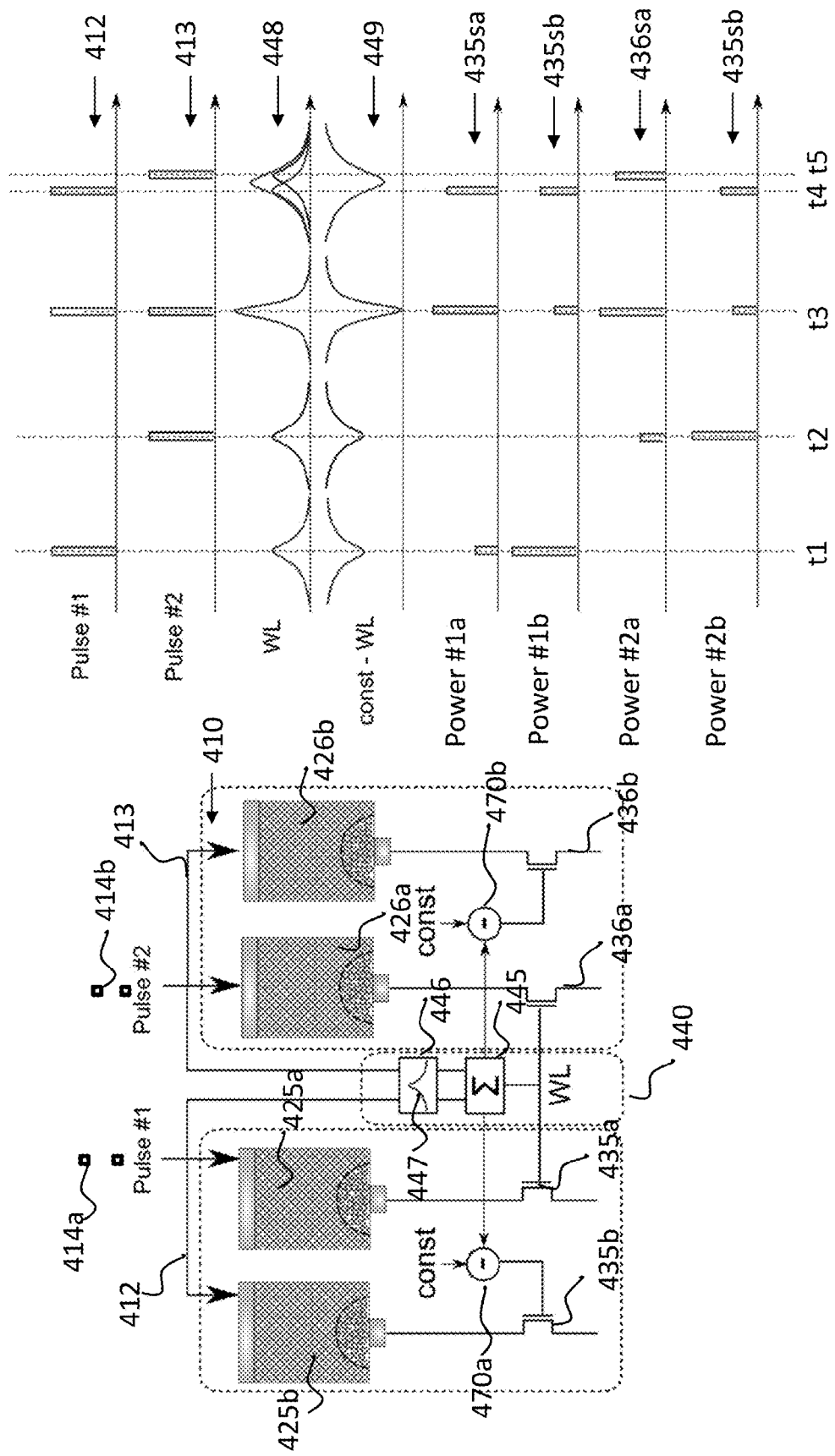

– 1 –

CORRELATION DETECTOR

BACKGROUND

The present invention relates to a correlation detector for detecting correlations in a plurality of parallel data streams of discrete events. The invention further relates to a corresponding method for detecting correlations in a plurality of parallel data streams of discrete events.

Correlation detection may refer to a cognitive computing primitive that aims at detecting structure or correlations in data streams. Mathematically this may be formulated as a goal to detect correlated random processes in a multitude of random processes that arrive at e.g. a computing system.

SUMMARY

According to one embodiment, a correlation detector comprising an input unit configured to receive a plurality of parallel data streams of discrete events. The correlation detector further comprises a memory array having a plurality of resistive memory elements. At least one of the resistive memory elements is allocated to each of the parallel data streams. Furthermore, a programming array is provided comprising a plurality of programming elements. At least one of the programming element is allocated to each resistive memory element for applying a programming signal to the respective memory element. The correlation detector comprises further a control unit that is configured to control the programming signals as a function of a co-arrival characteristic of the discrete events. A correlation unit is configured to detect correlations between the received data streams based on resistance changes of the resistive memory elements.

According to another embodiment, a method for detecting correlations in a plurality of parallel data streams of discrete events. A plurality of parallel data streams of discrete events is received and at least one resistive memory element is allocated to each of the received data streams. A programming signal is applied to the respective memory element. The programming signal is controlled as a function of a co-arrival characteristic of the discrete events. Correlations between the received data streams are detected based on resistance changes of the resistive memory elements.

BRIEF DESCRIPTION OF THE DRAWINGS

FIG. 3a shows resistive memory elements of a correlation detector;

FIG. 3b is a timing diagram of input pulses and programming signals corresponding to the detector of FIG. 3a;

FIG. 4a shows resistive memory elements of a correlation detector;

FIG. 4b is a timing diagram of input pulses and programming signals corresponding to the detector of FIG. 4a;

DETAILED DESCRIPTION

Figure 1:
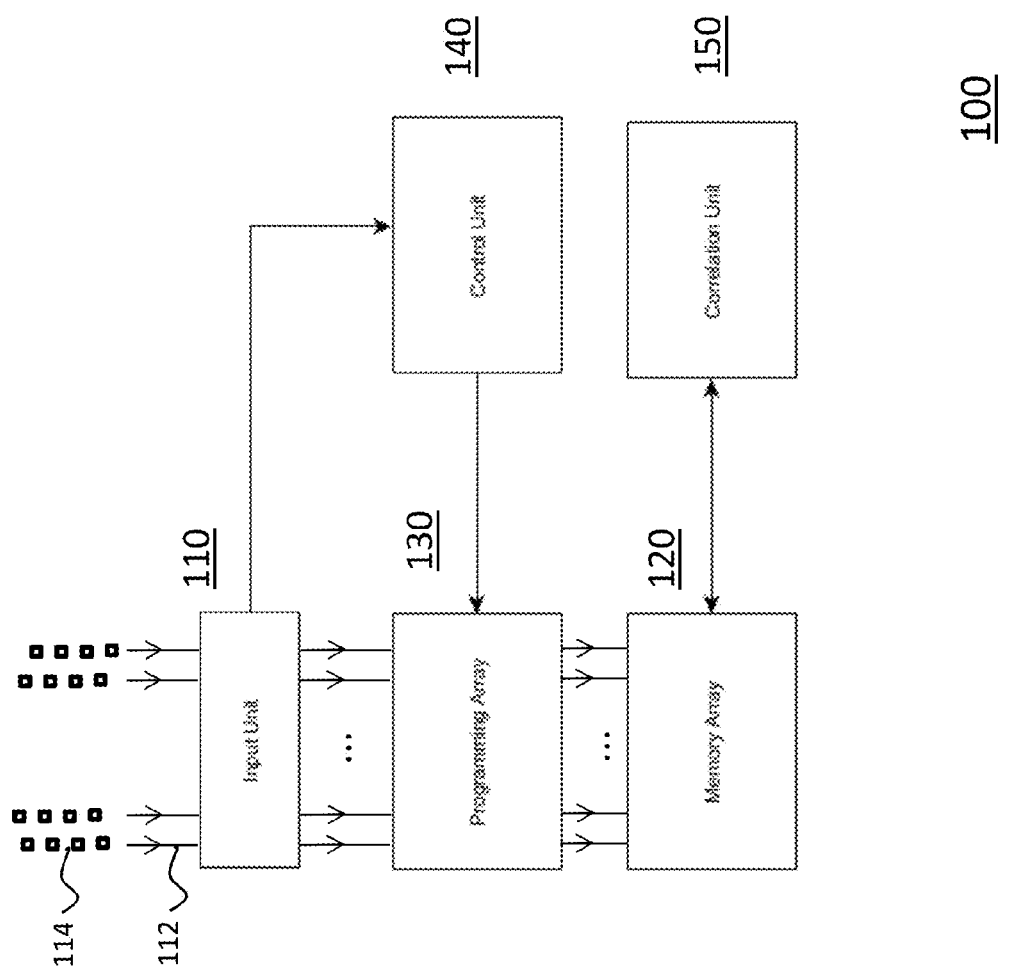
FIG. 1 illustrates a block diagram of a correlation detector.

A resistive memory element may be defined as a memory element whose electrical resistance can be changed by applying an electrical signal to the resistive memory element. The electrical signal may be e.g. a current flowing through the device, or an electrical voltage applied to the resistive memory device. The current and/or voltage may be e.g. applied to the resistive memory element in the form of pulses. As a result, the electrical resistance of a resistive memory elements depends on the history of current that had previously flown trough the device and/or the history of the electric signal that had been applied to the resistive memory element.

Resistive memory elements are based on a physical phenomenon occurring in a material that changes its resistance under action of a current or electric field. The change is usually non-volatile and reversible. Several classes of resistive memory elements are known, ranging from metal oxides to chalcogenides. Typical resistive memory elements are metal/insulator/metal structures where the metallic components serve as the electrodes and the insulator is a resistive switching material, e.g. a chalcogenide. These resistive memory elements exhibit good performance in terms of power consumption, integration density potential, retention, and endurance.

The term correlation detection may refer to a cognitive computing primitive that aims at detecting structure or correlations in data streams. Mathematically this may be formulated as a goal to detect correlated random processes in a multitude of random processes that arrive e.g. at a computing system. Let us assume there are N discrete random processes $X_j(k)$, wherein $j=1 \ldots N$ denotes the process number and k denotes time. A subset of the processes is correlated and the rest is uncorrelated. A correlation detector may be used to find out e.g. whether there are any correlated processes, how many processes are correlated and which ones are correlated.

A discrete event may refer to all kind of events occurring in a data stream. The events may relate to any kind of field, e.g. to financial, technology or medical data. As an example, the events could be the illumination of pixels in an image sequence, the arrival of astronomic signals from a radio-telescope or the occurrence of financial transactions, e.g. stock trades.

A co-arrival characteristic of the discrete events may generally refer to any characteristic that can be used to characterize the co-arrivals, i.e. the simultaneous arrivals of discrete events. According to one embodiment, a co-arrival characteristic may be the number of discrete events that arrive simultaneously at any instant in time. According to another embodiment, the co-arrival characteristic may be the number of co-arrivals of the discrete events that arrive within a predefined interval of time. As simple example, if N discrete events arrive at a respective point in time, this respective point in time may be given a co-arrival characteristic of N. So if 4 discrete events arrive at a respective point in time, this respective point in time may be given a co-arrival characteristic of 4, whereas a co-arrival of 2 events would have only a co-arrival characteristic of 2.

A function of the co-arrival characteristic may generally be any linear or non-linear function. This includes a Gaussian function, an exponential function, a symmetric or an asymmetric function. With such function the time window during which co-arrivals are considered by the control unit can be adjusted. As an example, co-arrivals that happen exactly at the same time may be given a higher weight than co-arrivals that arrive within a predefined interval, but with some delay between the arrivals.

FIG. 1 illustrates in a schematic way a correlation detector 100 according to an embodiment of the present invention.

The correlation detector 100 comprises an input unit 110 for receiving a plurality of parallel data streams 112 of discrete events 114. The discrete events 114 may generally relate to all kind of data as mentioned above. The discrete events of the parallel data streams establish random processes. The correlation detector 100 can be adapted to detect correlations in these random processes that may arrive e.g. at a computing system. The correlation detector 100 comprises a memory array 120 comprising a plurality of resistive memory elements, wherein at least one resistive memory element is allocated to each of the data streams 112. The correlation detector 100 further comprises a programming array 130 and the programming array 130 comprises a plurality of programming elements. At least one programming element is allocated to each resistive memory element for applying a programming signal to the respective memory element.

The correlation detector 100 comprises further a control unit 140 configured to control the programming signals as a function of a co-arrival characteristic of the discrete events. In addition, a correlation unit 150 is provided to detect correlations between the received data streams based on conductance and/or resistance changes of the resistive memory elements of the memory array 120.

As mentioned above, the function of the co-arrival characteristic may be a function of the number of co-arrivals of the discrete events at any instant in time or the number of co-arrivals within a predefined interval. The function may be e.g. a linear or non-linear function. For illustration purposes, let us assume a simple example with 5 random processes P1, P2, P3, P4 and P5. Let us further assume that P1 and P5 show some correlation, wherein P2, P3 and P4 are uncorrelated. The correlation between P1 and P5 would result in a higher co-arrival rate of discrete events in the correlated processes P1 and P5 than in the non-correlated processes P2, P3 and P4. Accordingly the function of the co-arrival characteristic could e.g. specify to apply a higher programming signal, e.g. a higher power, to the memory cells that are allocated to the processes P1 and P5 than to the memory cells that are allocated to the processes P2, P3 and P4. According to this embodiment, the higher programming power applied to P1 and P5 would cause a greater resistance change of the resistive memory elements allocated to the processes P1 and P5 than of the resistive memory elements P2, P3 and P4. According to embodiments, this difference in resistance or resistance change is measured by the correlation unit 150 and may be used to detect a correlation between the processes P1 and P5.

Figure 2:
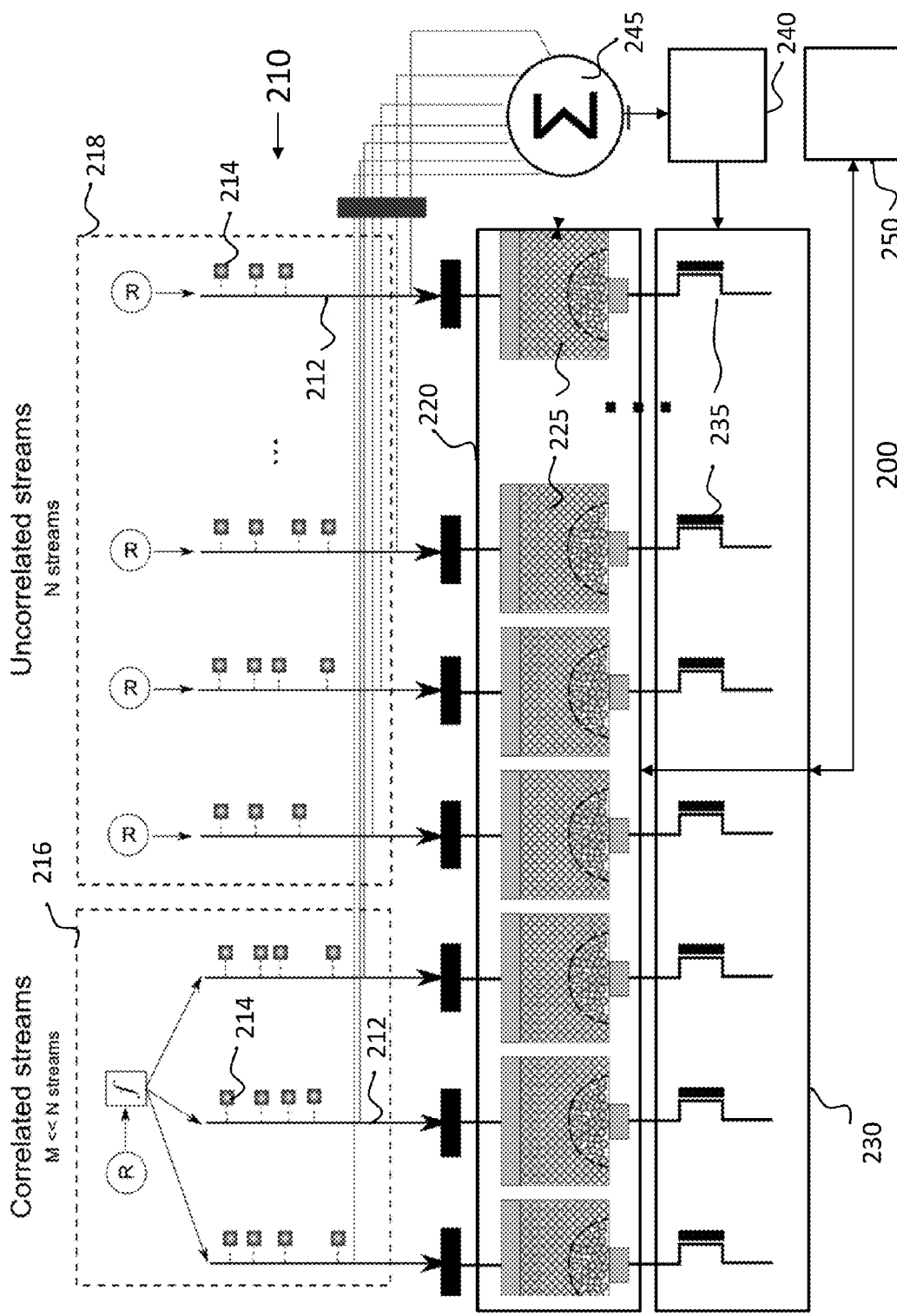
FIG. 2 shows a correlation detector.

Referring now to FIG. 2, a correlation detector 200 according to an embodiment is provided. The correlation detector 200 comprises an input unit 210, a memory array 220, a programming array 230, a control unit 240 and a correlation unit 250.

The input unit 210 receives a plurality N of parallel data streams 212 of discrete events 214. It is assumed that the discrete events 214 are the realizations of the random processes R. It is assumed that a subset 216 of the parallel data streams is correlated, indicated by a correlation function $f$. A subset 218 of the parallel data streams is not correlated.

The memory array 220 comprises a plurality of resistive memory elements 225. Each resistive memory element 225 is allocated to one of the parallel data streams 212 and the respective data stream 212 is provided as input signal to the allocated resistive memory element 225. According to the embodiment of FIG. 2, the resistive memory element is a phase change memory (PCM) cell.

The input unit 210 is coupled to the memory array 220 and forwards the parallel data streams 212 as input signal to the respective resistive memory elements 225 of the memory array 220. The output of the memory array 220 is coupled to the programming array 230. The programming array 230 comprises a plurality of programming elements 235. Each programming element 235 is coupled in a series connection to one of the resistive memory elements 225 and thereby allocated to one of the resistive memory elements 225. The programming elements 235 are embodied as transistors, wherein the drain of the transistors is coupled to the restive memory elements 225 of the memory array 220. By means of the programming elements 235 a programming signal can be applied to the resistive memory elements 225. In this respect the programming elements 235 are used to apply programming pules as programming signals to the respective memory element 225. If the programming elements 235 are switched on, a programming pulse is applied to the respective memory element 225 and if the programming elements 235 are switched off, no programming pulse/programming signal is applied to the respective memory element 225. By applying programming pulses to the resistive memory elements 225, the resistance of the resistive memory elements 225 can be changed. The programming pulses may be in particular voltage or current pulses, resulting in electrical power applied to the respective memory elements 225. According to embodiments, the resistive memory elements 225, embodied as PCM cells, are operated in the left part of the resistance-current programming curve of the PCM cells. Accordingly, initially a Reset-pulse is applied to the PCM cells 225 in order to bring the PCM-cells 225 in the amorphous state. Then during the correlation detection current and/or voltage pulses are applied to the PCM cells as programming signals that heat the PCM cells 225 above the crystallization temperature and result in a partial crystallization of the PCM cells 225. Accordingly, the resistance of the resistive memory elements 225 is lowered by the application of the current and/or voltage pulses.

The control unit 240 is coupled to the programming array 230 and controls the programming signals applied by the programming elements 235. More particularly, the control unit 240 controls the gate voltage of the programming elements 235, embodied as transistors, and thereby switches the transistors 235 on and off. The control unit 240 is coupled to a summation stage 245. Alternatively, the summation stage 245 may be implemented within the control unit 240 and be part of the control unit 240. The summation stage 245 is coupled to the input unit 210 and provides a summation signal of the discrete events to the control unit. The summation signal may be e.g. the number of discrete events 214 that arrive at the input unit 210 simultaneously at a respective point in time. The control unit 240 controls the gate voltages of the transistors 235 then as a function of a co-arrival characteristic of the discrete events, e.g. as a function of the number of simultaneous arrivals of discrete events at a respective point in time.

A correlation unit 250 is coupled to the memory array 220 and/or the programming array 230. The correlation unit 250 is configured to detect correlations between the received data streams 212. The correlation unit 250 may e.g. observe and measure the resistance and/or conductance of the resistive memory elements 225 and/or measure resistance and/or conductance changes of the resistive memory elements 225. Then the correlation unit 250 may derive from such measurements information about correlations between the data streams 212.

In mathematical terms, aspects of the correlation detector 200 may be explained as follows.

Let us assume the discrete events 214 of the data streams 212 are the realizations of the N discrete random processes Xj(k), wherein j=1 . . . N. The subset 216 of them is correlated and the subset 218 is uncorrelated. Hence the correlation detector 200 receives an input signal stream:

$$\{X_j(k)\}_{j=1}^N,$$

wherein, Xj(k) is a discrete event in the parallel stream j at time k.

Now, each non-zero Xj(k) will result in a pulse applied to the corresponding j-th resistive memory element. The corresponding input power or duration of the application of the power will be a function of the co-arrival characteristic of the discrete events.

According to an embodiment as illustrated in FIG. 2, the number of co-arrivals, i.e. the sum of the simultaneous arrivals at any instant in time, is used as co-arrival characteristic. This may also be referred to as the collective momentum. Mathematically, the collective momentum Mc(k) of discrete events Xj(k) of N parallel data streams may be expressed by the formula:

$$M_c(k) = \Sigma_{j=1}^N X_j(k),$$

where Mc(k) corresponds to the number of co-arrivals/simultaneous arrivals at any instant in time. In other words, the more discrete events arrive at an instant in time, the higher the co-arrival characteristic and the corresponding collective momentum Mc(k) of the parallel data streams at the instant in time k.

The control unit 250 receives this collective momentum Mc(k) from the summation unit 245 and controls the programming elements 235 as a function of this collective momentum.

According to one embodiment, the control unit controls the duration W of the application of power Pinp applied to the resistive memory elements 225 as a function G of the collective momentum Mc(k). This can be mathematically formulated as:

$$W(k) = G(M_c(k)).$$

According to another embodiment, the control unit controls the input power Pinp applied to the resistive memory elements 225 as a function F of the collective momentum Mc(k). This can be mathematically formulated as:

$$P_{inp}(k) = F(M_c(k)),$$

The functions F or G can be linear or non-linear.

Hence, according to embodiments, the programming array 230 will apply a programming signal to turn on the corresponding programming element 235 for each non-zero event Xj(k), while the corresponding input power or duration of the application of the power applied to the respective resistive memory element 225 will be a function F or G of the collective momentum Mc(k).

Figures 3A, 3B:
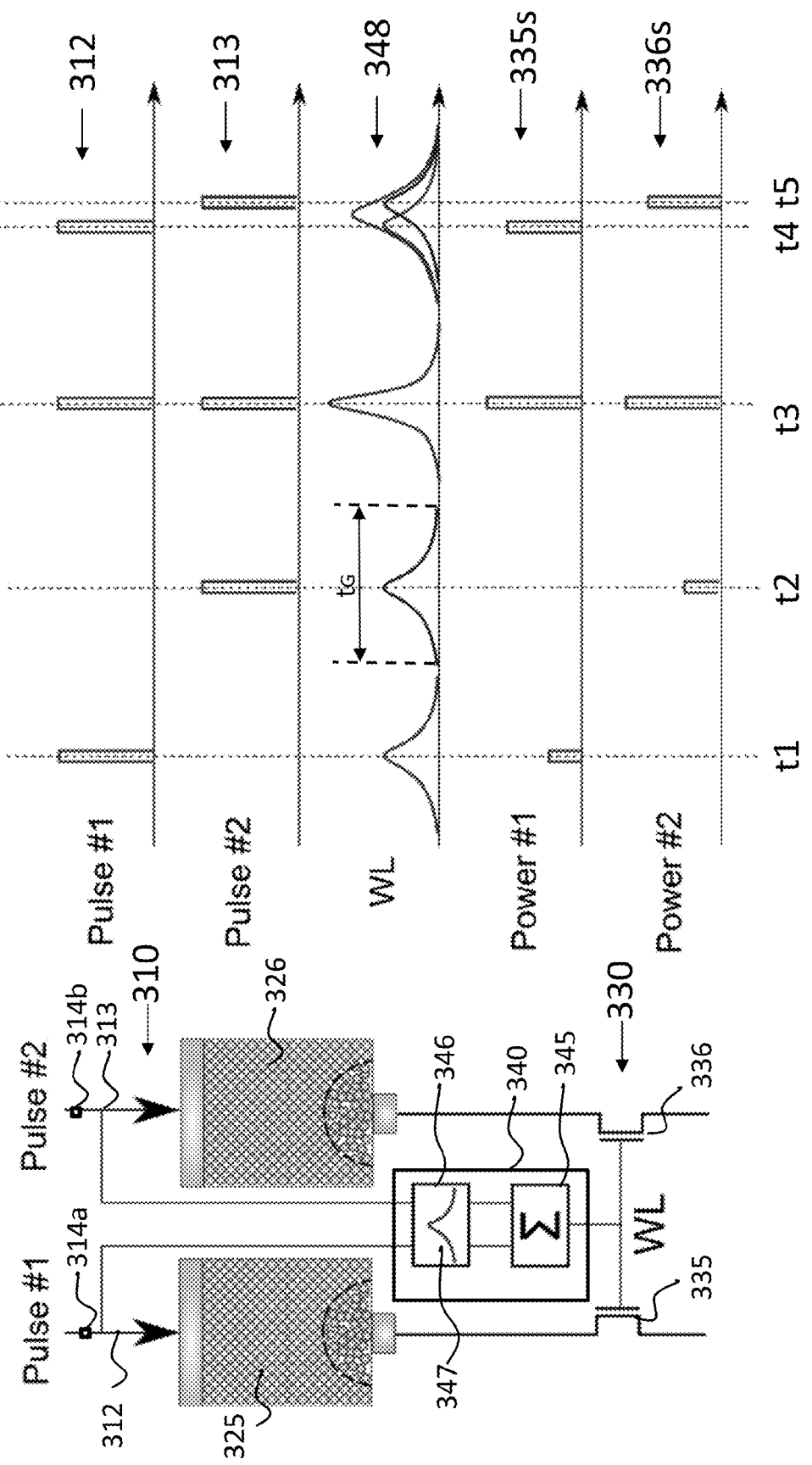

FIG. 3a shows two exemplary resistive memory elements of a correlation detector according to embodiments of the invention. FIG. 3b illustrates in a schematic way a corresponding timing diagrams of input pulses and of the input power applied to two resistive memory elements, namely to a first resistive memory element 325 and a second resistive memory element 326. The first resistive memory element 325 and the second resistive memory element 326 are again embodied as PCM cells and arranged in an input unit 310. The first resistive memory element 325 receives as data stream a first pulse stream 312 comprising random occurrence of pulses 314a, also denoted as first pulse stream Pulse #1 and the second resistive memory element 326 receives as data stream a second pulse stream 313 comprising random occurrence of pulses 314b, also denoted as second pulse stream Pulse #2. The first resistive memory element 325 is arranged in a series connection with a first programming element 335 and the second resistive memory element 326 is arranged in a series connection with a second programming element 336. The first programming element 335 and the second programming element 336 are embodied as transistors. By means of the first programming element 335 and the second programming element 336 a programming signal 335s can be applied to the first resistive memory element 325 and a programming signal 336s to the second resistive memory element 326 respectively. According to this embodiment the programming signal 335s applied to first resistive memory element 325 and the programming signal 336s applied to the second resistive memory element 326 corresponds to the electrical power, also denoted as Power #1 and Power #2, applied to the first resistive memory element 325 and the second resistive memory element 326 respectively in response to the random pulses 314 a and 314b received at the input of the PCM cells. The power applied to the first resistive memory element 325 and the second resistive memory element 326 is controlled by a control unit 340. The control unit 340 is coupled to the input unit 310 and receives as input the random pulse streams 314a and 314b. The control unit 340 comprises a functional unit 346 and a summation stage 345. The functional unit 346 applies a predefined function, e.g. a Gaussian function, on the pulses 314a and 314b. The summation stage 345 adds then the output signals of the functional unit 346 and applies a corresponding wordline signal WL as control signal to the programming elements 335 and 336. The first resistive memory element 325 and the second resistive memory element 326 may be e.g. part of a row in a larger memory array. Hence the control signal applied to the gates of the first and the second programming array is denoted as wordline signal WL.

The timing diagram of FIG. 3b illustrates how the power applied to the first resistive memory element and the second resistive memory element is controlled in dependence on correlations in pulses of the input pulse stream 312 and the input pulse stream 313. The x-axis of the diagrams denotes the time. The y-axis of the timing diagram Pulse #1 illustrates an example of a voltage or current of the pulses 314a of the first pulse stream 312. The y-axis of the timing diagram Pulse #2 illustrates an example of a voltage or current of the pulses 314b of the second pulse stream 313. The y-axis of the timing diagram WL illustrates the corresponding wordline signals WL applied to the gates of the programming elements 335 and 336. The y-axis of the timing diagram Power #1 illustrates the corresponding power applied to the first resistive memory element 325 and the y-axis of the timing diagram Power #2 illustrates the corresponding power applied to the second resistive memory element 326.

At a point in time t1 only the first pulse stream 312 comprises a pulse as discrete event, wherein the second pulse stream 313 does not comprise a pulse as discrete event. Accordingly, only a small electrical power is applied to the first resistive memory element 325 and no power is applied to the second resistive memory element 326.

At a point in time t2 it is vice versa, i.e. only the second pulse stream 313 comprises a pulse as discrete event, wherein the first pulse stream 312 does not comprise a pulse as discrete event. Accordingly, only a small electrical power is applied to the second resistive memory element 325, wherein no power is applied to the first resistive memory element 326.

At a point in time t3 both the first pulse stream 312 and the second pulse stream 313 comprise a pulse as discrete event. Accordingly, a large electrical power is applied to both the first resistive memory element 325 and the second resistive memory element 326. Hence the correlation of the first pulse stream 312 and the second pulse stream 313 at the point in time t3 results in a higher power applied to both resistive memory elements 325 and 326 allocated to the correlated data streams. This higher electrical power then effects a higher resistance and/or conductance change which may then be used by the correlation unit to detect correlations between the first pulse stream 312 and the second pulse stream 313.

At a point in time t4 only the first pulse stream 312 comprises a pulse as discrete event, wherein the second pulse stream 313 does not comprise a pulse as discrete event. At a point in time t5 only the second pulse stream 313 comprises a pulse as discrete event, wherein the first pulse stream 312 does not comprise a pulse as discrete event. However, as t4 and t5 are relatively close to each other, the Gaussian functions applied by the functional unit 346 result in an overlap of output signals of the functional unit 346. This allows to detect and capture correlations between pulses that arrive within a predefined interval of time. In this example, the predefined interval of time is given by the time interval tG of the Gaussian function 347 applied by the functional unit 346. This allows to reward correlations between co-arrivals of pulses within the interval tG and to thereby capture correlations between pulses that arrive within the interval tG.

Accordingly, a relatively large electrical power is applied to the first resistive memory element 325 at the point in time t4 and also a relatively large electrical power is applied the second resistive memory element 326 at the point in time t5. More particularly, the electrical power applied at the points in time t4 and t5 is higher than the electrical power applied at the points in time t1 and t2. This higher electrical power then effects a higher resistance and/or conductance change which may then be used by the correlation unit to detect correlations between the first pulse stream 312 and the second pulse stream 313, even though there is some delay between the correlations of the discrete events.

The signal 348 applied on the wordline WL to the programming elements 335 and 336 establishes according to an embodiment a function of the co-arrival characteristic which the control unit 340 provides to control the programming signals 335s and 336s. According to this embodiment, the function 348 is a function of the number of co-arrivals of the discrete events within a predefined interval of time due to the application of the Gaussian function 347 by the functional unit 346.

FIG. 4a shows 4 exemplary resistive memory elements of a correlation detector according to another embodiment of the invention. FIG. 4b illustrates in a schematic way corresponding timing diagrams of input pulses and of the input power applied to the 4 resistive memory elements. More particularly, a first set of resistive memory elements 425a and 426a is provided and a second set of resistive memory elements 425b and 426b.

The resistive memory elements 425a, 425b, 426a and 426b are embodied as PCM cells. The resistive memory elements 425a and 425b receive as data stream a first pulse stream 412 comprising random pulses 414a, also denoted as first pulse stream Pulse #1 and the resistive memory elements 426a, 426b receive as data stream a second pulse stream 413 comprising random pulses 414b, also denoted as second pulse stream Pulse #2. The resistive memory element 425a is arranged in a series connection with a programming element 435a, the resistive memory element 425b is arranged in a series connection with a programming element 435b, the resistive memory element 426a is arranged in a series connection with a programming element 436a and the resistive memory element 426b is arranged in a series connection with a programming element 436b. The programming elements 435a, 435b, 436a and 436b are embodied as transistors. By means of the programming elements 435a, 435b, 436a and 436b a programming signal can be applied to the resistive memory elements 425a, 425b, 426a and 426b. According to this embodiment the programming signal applied to the resistive memory elements 425a, 425b, 426a and 426b corresponds to electrical power signals 435sa, 435sb, 436sa and 436sb, also denoted as Power #1a, Power #1b, Power #2a and Power #2b, applied to the resistive memory elements 425a, 425b, 426a and 426b respectively in response to the pulse streams 412 and 413 received at the input of the PCM cells.

The power applied to the resistive memory elements 425a, 425b, 426a and 426b is controlled by a control unit 440. The control unit 440 receives as input the random pulse streams 412 and 413. The control unit 440 comprises a functional unit 446 and a summation stage 445. The functional unit 446 applies a predefined function 447, e.g. a Gaussian function, on the pulses 414a and 414b. The summation stage 445 adds then the output signals of the functional unit 446 and applies a corresponding wordline signal WL as control signal to the programming elements 435a and 436a of the first set. The output of the summation stage 445 is further coupled to a subtraction unit 470a and a subtraction unit 470b. The subtraction unit 470a subtracts the wordline signal WL provided by summation stage 445 from a predefined constant value const and provides the result as control signal to the gate of the programming unit 435b. The subtraction unit 470b subtracts the wordline signal WL provided by summation stage 445 also from the predefined constant value const and provides the result as control signal to the gate of the programming unit 436b.

The timing diagram of FIG. 4b illustrates how the power applied to the resistive memory elements 425a, 425b, 426a and 426b is controlled in dependence on correlations in pulses of the input pulse streams 412 and 413. The x-axis of the diagrams denotes the time. The y-axis of the timing diagram Pulse #1 illustrates an example of a voltage or current of the pulses 414a of the pulse stream 412. The y-axis of the timing diagram Pulse #2 illustrates an example of a voltage or current of the pulses 414b of the pulse stream 413. The y-axis of the timing diagram WL illustrates the corresponding wordline signals WL applied to the gates of the programming elements 435a and 436a. The y-axis of the timing diagram const-WL illustrates the corresponding wordline signals WL applied to the gates of the programming elements 435b and 436b. The y-axis of the timing diagram Power #1a illustrates a programming signal 435sa, corresponding to the electrical power applied to the resistive memory element 425a. The y-axis of the timing diagram Power #1b illustrates a programming signal 435sb, corresponding to the electrical power applied to the resistive memory element 425b. The y-axis of the timing diagram Power #2a illustrates a programming signal 436sa, corresponding to the electrical power applied to the resistive memory element 426a. Finally, the y-axis of the timing diagram Power #2b illustrates a programming signal 436sb, corresponding to the electrical power applied to the resistive memory element 426b.

The timing diagrams Power#1a and Power#2a correspond to the timing diagrams Power#1 and Power#2 of FIG. 3. Accordingly, a correlation of the discrete events/pulses in the input pulse streams 412 and 413 result in a higher power applied to the resistive memory elements 425a and 426a. At the point in time t1 only the first pulse stream 412 comprises a pulse as discrete event, wherein the second pulse stream 413 does not comprise a pulse as discrete event. Accordingly, at t1 only a small electrical power is applied to the resistive memory element 425a and no power is applied to the resistive memory elements 426a. At a point in time t2 it is vice versa, i.e., only the second pulse stream 413 comprises a pulse as discrete event, wherein the first pulse stream 412 does not comprise a pulse as discrete event. Accordingly, no electrical power is applied to the resistive memory element 425a, wherein a small power is applied to the resistive memory element 426a. At a point in time t3 both the first pulse stream 412 and the second pulse stream 413 comprise a pulse as discrete event. Due to the correlation, a large electrical power is applied to the resistive memory elements 425a and 426a. At a point in time t4 only the first pulse stream 412 comprises a pulse as discrete event, wherein the second pulse stream 413 does not comprise a pulse as discrete event. At a point in time t5 only the second pulse stream 413 comprises a pulse as discrete event, wherein the first pulse stream 412 does not comprise a pulse as discrete event. However, as t4 and t5 are relatively close to each other, the Gaussian function 447 applied by the functional unit 446 results in an overlap of the output signals of the functional unit 446. This allows to detect and capture correlations between pulses that arrive within a predefined interval of time given by the time interval tG of the Gaussian function 447 applied by the functional unit 446.

Accordingly, a relatively large electrical power is applied to the resistive memory elements 425a at the point in time t4 and also a relatively large electrical power is applied to the resistive memory element 426a at the point in time t5. More particularly, the electrical power applied at the points in time t4 and t5 is higher than the electrical power applied at the points in time t1 and t2. This higher electrical power then effects a higher resistance and/or conductance change which may then be used by the correlation unit to detect correlations between the first pulse stream 412 and the second pulse stream 413, even though there is some delay between the correlations of the discrete events.

In summary, the resistive memory elements 425a and 426a establish a first set of resistive memory elements that receive more input power in case of a high correlation between the data/pulse streams 412 and 413 than in the case of a low correlation between the data/pulse streams 412 and 413.

In the following the timing diagrams Power#1b and Power#2b are explained. The timing diagrams Power#1b and Power#2b have a different and rather opposite characteristic than the timing diagrams Power#1a and Power#2a. As can be seen in FIG. 4b, at the point in time t1 a large electrical power is applied to the resistive memory element 425b, although there is only a pulse arriving in the pulse stream 412, and no power is applied to the resistive memory element 426b. At the point in time t2 a large electrical power is applied to the resistive memory element 426b, although there is only a pulse arriving in the pulse stream 413, and no power is applied to the resistive memory element 425b. On the contrary, at the point in time t3 a low electrical power is applied to the resistive memory elements 425b and 426b, although there is a co-arrival of two pulses in the pulse streams 412 and 413. Accordingly, the second set of resistive memory elements 425b and 426b receive a relatively high input power in case of non-correlated pulse streams 412 and 413 and a relatively low input power in case of correlated pulse streams 412 and 413. Accordingly the conductance of the resistive memory elements 425b and 426b decreases more or quicker in case of a low correlation between the pulse streams 412 and 413 than in the case of a high correlation between the pulse streams 412 and 413.

In summary, the first set of resistive memory elements 425a and 426a change their resistance quicker in case of a high correlation between the data streams 412 and 413 and the second set of resistive memory elements 425b and 426b change their resistance quicker in case of a low or non-correlation between the data streams 412 and 413. In other words, the first set of resistive memory elements 425a and 426a rewards a high correlation between the data streams 412 and 413 and penalizes non-correlation, wherein the second set of resistive memory elements 425b and 426b rewards non-correlation or low-correlation between the data streams 412 and 413 and penalizes a high correlation.

This can be e.g. used by the correlation unit to perform differential conductance and/or resistance measurements from the two sets of resistive memory elements. With such differential measurements the contrast of the measurements and the working range of the correlation detector can be enlarged according to embodiments of the invention.

As illustrated in FIG. 4b, the control unit 440 controls the programming signals 435sa and 436sa applied to the resistive memory elements 425a and 426a of the first set as a first function 448 of the co-arrival characteristic of the discrete events 414a and 414b. Furthermore, the control unit 440 controls the programming signals 435sb and 436sb applied to the resistive memory elements 425b and 426b of the second set as a second function 449 of the co-arrival characteristic of the discrete events 414a and 414b. The first function corresponds to the wordline signal WL and the second function corresponds to the signal Const-WL.

According to embodiments the first function 448 is used to increase the conductance of the first set of memory elements 425a and 426a for a strong co-arrival characteristic, wherein the second function 449 is used to increase the conductance of the second set of memory elements 425b and 426b for a weak co-arrival characteristic.

Figure 5:
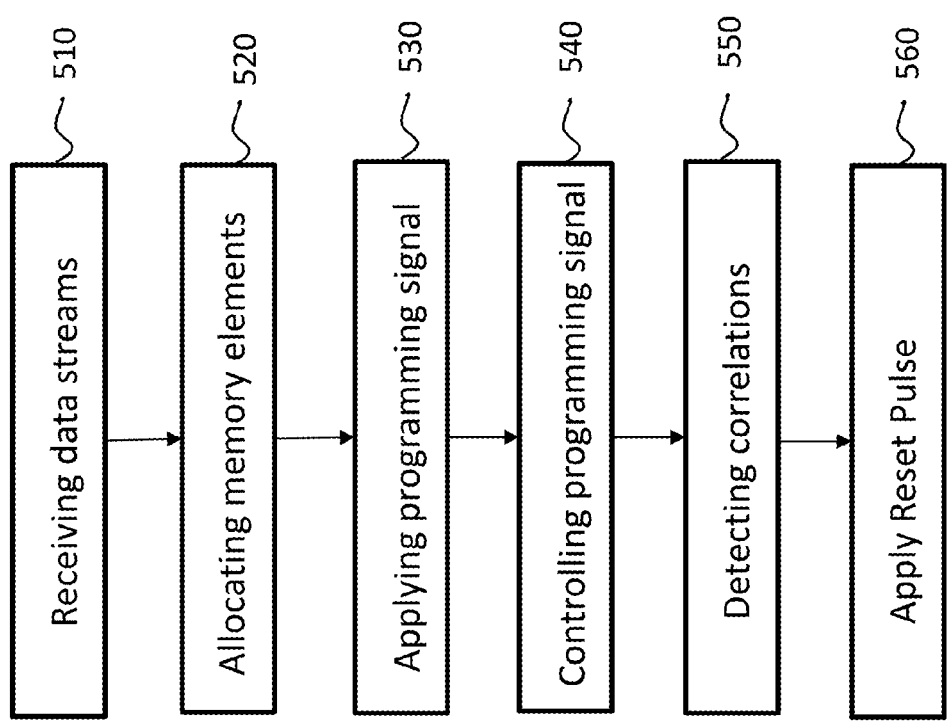
FIG. 5 is a flow diagram of method steps of a method.

FIG. 5 illustrates a method for detecting correlations in a plurality of parallel data streams of discrete events according to embodiments of the invention. The method may be implemented by operating detectors as described above.

At step 510, a plurality of parallel data streams of discrete events is received, e.g. at the detector 100 according to embodiments of the invention.

At step 520, at least one resistive memory element is allocated to each of the received data streams. As an example the memory elements 225 of FIG. 2 are allocated to the data streams 212.

At step 530, a programming signal is applied to the respective memory element, e.g. the electrical power denoted as Power #1 and Power #2 as explained with reference to FIG. 2.

At step 540, the programming signal is controlled as a function of a co-arrival characteristic of the discrete events. The step may be e.g. performed by the control units 140, 240, 340 or 440.

At step 550, correlations are detected between the received data streams based on resistance and/or conductance changes of the resistive memory elements. This step may be performed e.g. by the correlation unit 150 as described with reference to FIG. 1.

Furthermore, after the correlation detection has finished, at step 560 a Reset-pulse is applied to the resistive memory elements, embodied as PCM cells, in order to bring the PCM-cells back in the amorphous state.

Then the steps 510, 520, 530, 540 and 550 may be performed again in an iterative manner.

The step 540 may in particular comprise applying current pulses as programming signal to the PCM cells, thereby heating the PCM cells above the crystallization temperature and lowering the resistance of the PCM cells.

Figure 6:
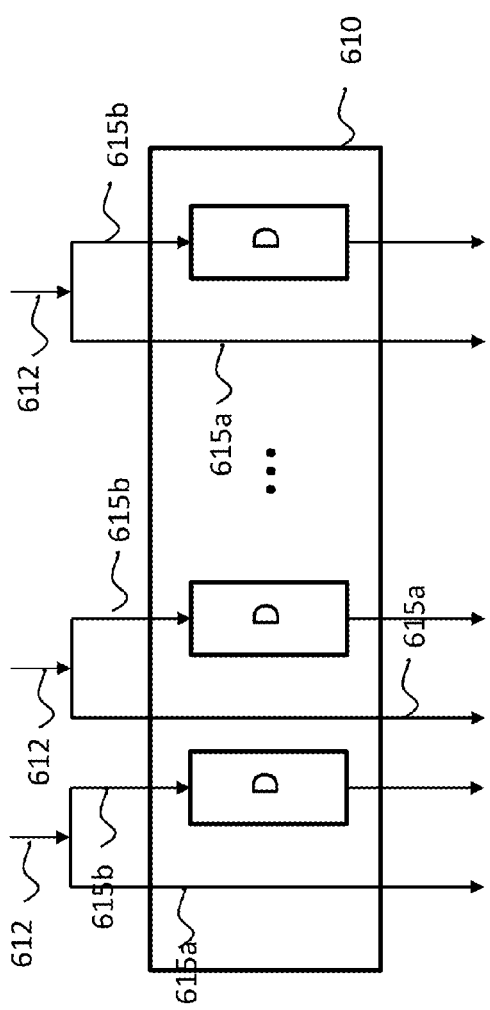
FIG. 6 shows an exemplary embodiment of an input unit comprising delay units.

FIG. 6 shows an exemplary embodiment of an input unit 610 according to an embodiment of a correlation detector of the invention. The input unit 610 receives a plurality of parallel data streams 612 of discrete events. Each of the data streams 612 is fed to a first path 615a and a second parallel path 615b. The first path 615a is coupled directly to the resistive memory elements, while the second path 615b comprises an adjustable delay unit D for delaying the data streams 612 before they are forwarded to the allocated resistive memory elements. Such an input unit comprising delay lines allows to detect correlations between correlated data streams 612 that arrive with a fixed delay in time.

Figure 7:
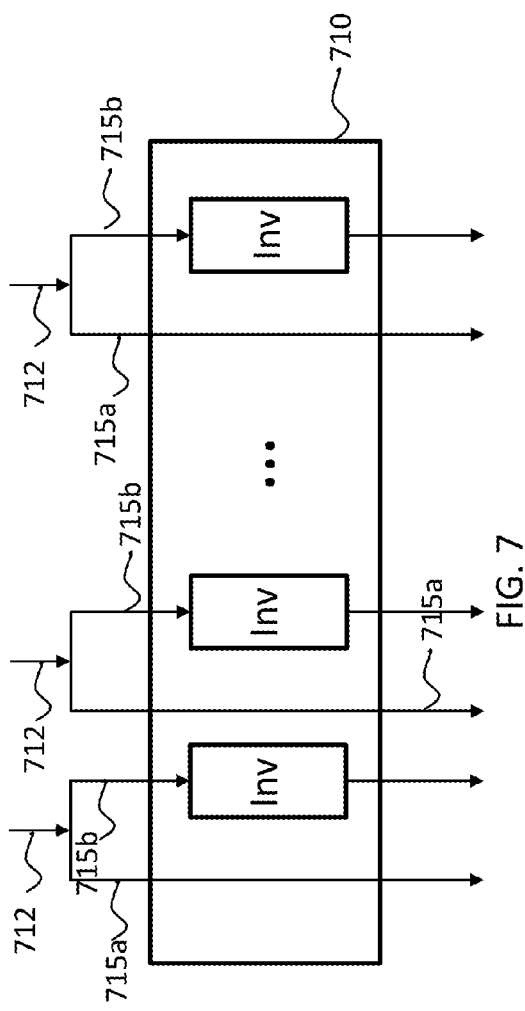
FIG. 7 shows an exemplary embodiment of an input unit comprising inverter units.

FIG. 7 shows another exemplary embodiment of an input unit 710 according to an embodiment of a correlation detector of the invention. The input unit 710 receives a plurality of parallel data streams 712 of discrete events. Each of the data streams 712 is fed to a first path 715a and a second parallel path 715b. The first path 715a is coupled directly to the resistive memory elements, while the second path 715b comprises an inverter unit Inv. for inverting the incoming data streams, thereby operating on the inverse of the incoming processes. More particularly, the inverter units Inv. are provided for altering the received data stream 712 such that an arrival of a discrete event is altered to a non-arrival and a non-arrival of a discrete event is altered to an arrival. This allows to capture negative correlations in the received data streams.

Figure 8:
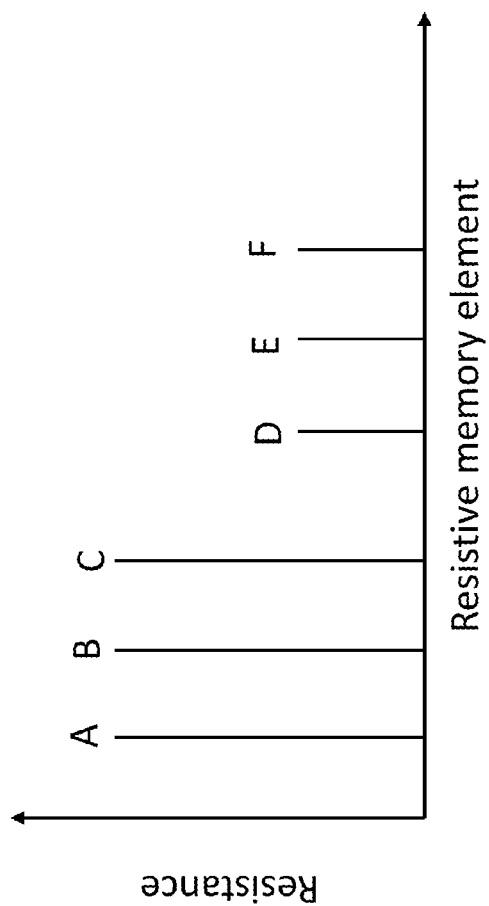
FIG. 8 illustrates an exemplary embodiment of the distribution of the resistance of resistive memory elements of a correlation detector according to an embodiment.

FIG. 8 illustrates an exemplary embodiment of the distribution of the resistance of six resistive memory elements A, B, C, D, E and F. The X-axis denotes the respective memory element and the y-axis the resistance value of the respective memory element. The resistance values may be e.g. continuously or in predefined intervals measured by the correlation unit 150. FIG. 8 illustrates the distribution at a specific point in time. As can be seen, the resistive memory elements A, B and C have a high resistance value, wherein the resistive memory elements D, E and F have a lower resistance value. In this embodiment it is assumed that the resistive memory elements A, B, C, D, E and F are PCM cells that are operated in the left part of the resistance-current programming curve of the PCM cells. Accordingly, the correlation detection is started in the amorphous state of the PCM cells. Then during the correlation detection the current pulses being applied to the PCM cells as programming signals heat the PCM cells A, B, C, D, E and F above the crystallization temperature. In this example, it is further assumed that the programming unit will apply in case of simultaneous arrivals/co-arrivals a higher power to the corresponding memory cells than in case of a single arrival. Accordingly, correlated data streams receive a higher input power than non-correlated data streams and the resistance of the restive memory elements allocated to correlated data streams decreases quicker than the resistance of the restive memory elements allocated to non-correlated data streams. Hence in this example the lower resistance of the resistive memory elements D, E, F indicates that they are allocated to correlated data streams, wherein the higher resistance of the resistive memory elements A, B, C indicates that they are allocated to non-correlated data streams.

Figure 9:
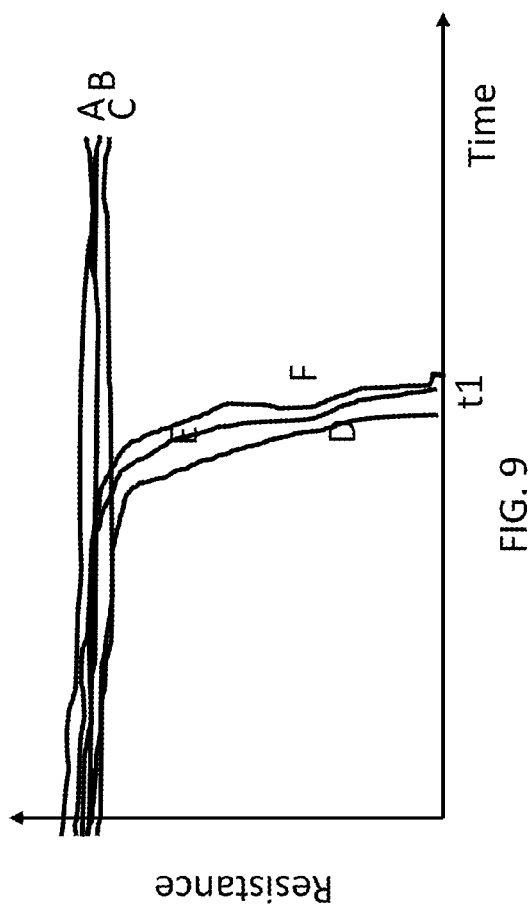
FIG. 9 illustrates an exemplary embodiment of the change of the resistance of resistive memory elements over time of a correlation detector according to an embodiment.

FIG. 9 illustrates an exemplary embodiment of the evolution of the resistance of six resistive memory elements A, B, C, D, E and F over time. The X-axis denotes the time and the y-axis the resistance value of the respective memory element. The resistance values are continuously measured e.g. by the correlation unit 150. As can be seen, the resistance of the resistive memory elements A, B and C remains substantially constant over time, while the resistance of the resistive memory elements D, E and F starts to drop significantly around a point in time t1. In this embodiment it is again assumed that the resistive memory elements A, B, C, D, E and F are PCM cells that are operated in the left part of the resistance-current programming curve of the PCM cells, that the correlation detection is started in the amorphous state of the PCM cells and that the programming unit will apply in case of simultaneous arrivals/co-arrivals a higher power to the corresponding memory cells than in case of a single arrival. Hence in this example the sharp drop in resistance of the resistive memory elements D, E, F indicates that they are allocated to correlated data streams, wherein the substantially constant resistance value of the resistive memory elements A, B, C indicates that they are allocated to non-correlated data streams.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A correlation detector comprising:
    an input unit configured to receive a plurality of parallel data streams of discrete events;
    a memory array comprising a plurality of resistive memory elements, wherein at least one of the resistive memory elements is allocated to each of the data streams;
    a programming array comprising a plurality of programming elements, wherein at least one of the programming elements is allocated to each resistive memory element for applying a programming signal to the respective memory element;
    a control unit configured to control the programming signals as a function of a co-arrival characteristic of the discrete events;

a correlation unit configured to detect correlations between the data streams based on resistance changes of the resistive memory elements.

2. A detector as claimed in claim 1, wherein the function of the co-arrival characteristic is function of the number of co-arrivals of the discrete events at any instant in time.

3. A detector as claimed in claim 1, wherein the function of the co-arrival characteristic is a function of the number of co-arrivals of the discrete events within a predefined interval of time.

4. A detector as claimed in claim 1, wherein the control unit is configured to control one of a voltage, a current and the duration of the application of power applied to the resistive memory elements.

5. A detector as claimed in claim 1, wherein the correlation unit is configured to measure a distribution of the resistance and/or conductance of the resistive memory elements.

6. A detector as claimed in claim 1, wherein the correlation unit is configured to measure a time at which the resistance and/or conductance of the resistive memory elements diverges.

7. A detector as claimed in claim 1, comprising one or more inverter units for altering one or more of the plurality of parallel data streams such that an arrival of a discrete event is altered to a non-arrival and a non-arrival of a discrete event is altered to an arrival.

8. A detector as claimed in claim 1, comprising one or more delay units for delaying one or more of the plurality of parallel data streams with a predefined delay.

9. A detector as claimed in claim 1, comprising:
   a first set of resistive memory elements; and
   a second set of resistive memory elements;
wherein the control unit is configured to control the programming signal applied to the resistive memory elements of the first set as a first function of the co-arrival characteristic of the discrete events and to control the programming signal applied to the resistive memory elements of the second set as a second function of the co-arrival characteristic of the discrete events.

10. A detector as claimed in claim 1, wherein the resistive memory elements are one of Phase change memory (PCM) elements, Conductive bridge resistive memory elements, Metal-oxide resistive random access memory (RRAM) elements and Magneto-resistive random access memory (MRAM) elements.

11. A detector as claimed in claim 1, wherein the programming unit comprises transistors as programming elements arranged in series to the resistive memory elements and wherein the control unit is configured to control the gate voltage of the transistors.

12. A detector as claimed in claim 1, wherein the resistive memory elements are Phase change memory cells and wherein the control unit is configured to:
   apply a Reset-pulse to the PCM cells in order to bring the PCM-cells in the amorphous state;
   apply current pulses to the PCM cells that heat the PCM cells above the crystallization temperature, thereby lowering the resistance of the PCM cells.

* * * * *